(12) United States Patent
Nicolson et al.

(10) Patent No.: US 8,279,019 B2
(45) Date of Patent: Oct. 2, 2012

(54) MILLIMETER-WAVE SWITCHES AND ATTENUATORS

(75) Inventors: Sean Timothy Nicolson, Mountain View, CA (US); Scott Kevin Reynolds, Westchester County, NY (US)

(73) Assignees: MediaTek Singapore Pte. Ltd., Singapore (SG); International Business Machines Corporation, Beaverton, OR (US)

( * ) Notice: Subject to any disclaimer, the term of this patent is extended or adjusted under 35 U.S.C. 154(b) by 311 days.

(21) Appl. No.: 12/776,444

(22) Filed: May 10, 2010

(65) Prior Publication Data

US 2011/0273248 A1    Nov. 10, 2011

(51) Int. Cl.
*H01P 1/22*    (2006.01)
(52) U.S. Cl. .................................................. 333/81 A
(58) Field of Classification Search ............... 333/81 A, 333/81 R; 327/308, 309
See application file for complete search history.

(56) References Cited

U.S. PATENT DOCUMENTS

| | | | |
|---|---|---|---|
| 6,518,840 B1 | 2/2003 | Rahn | |
| 6,882,829 B2 | 4/2005 | Mostov | |
| 7,023,294 B2 * | 4/2006 | Hauger et al. | 333/81 R |
| 7,505,790 B2 | 3/2009 | Chang | |
| 7,511,592 B2 | 3/2009 | Inoue | |
| 7,564,103 B2 | 7/2009 | Losehand | |
| 8,022,785 B2 * | 9/2011 | Zelenz | 333/81 R |
| 2008/0272824 A1 | 11/2008 | Fu | |
| 2009/0102542 A1 | 4/2009 | Reynolds | |
| 2009/0298443 A1 | 12/2009 | Ta | |
| 2010/0097119 A1 | 4/2010 | Ma | |

FOREIGN PATENT DOCUMENTS

| | | |
|---|---|---|
| DE | 199 09 521 A1 | 9/1999 |
| EP | 1544941 | 6/2005 |
| JP | S5019336 | 3/1975 |
| JP | S5888911 A | 5/1983 |
| JP | H0514120 A | 1/1993 |
| JP | 3107071 U | 1/2005 |

OTHER PUBLICATIONS

Li, "A 15-GHz integrated CMOS switch with 21.5-dBm IP1dB and 1.8-dB insertion loss", Symposium on VLSI Circuits, Jun. 17-19, 2004, pp. 366-367.
Lee, "The impact of semiconductor technology scaling on CMOS RF and digital circuits for wireless application," IEEE Trans. on Elec. Dev., vol. 52, No. 7, Jul. 2005, pp. 1415-1422.
Talwalkar, "Integrated CMOS transmit-receive switch using LC-tuned substrate bias for 2.4-GHz and 5.2-GHz applications," IEEE J. of Solid-State Circ., vol. 39, No. 6, Jun. 2004, pp. 863-870.
Kuo, "High-Speed SiGe HBT BiCMOS Circuits for Communication and Radar Transceivers", Thesis, Georgia Institute of Technology, Dec. 2006.

* cited by examiner

*Primary Examiner* — Stephen Jones
(74) *Attorney, Agent, or Firm* — Winston Hsu; Scott Margo

(57) ABSTRACT

An input attenuator may include a first input circuit having an RF_IN+ terminal, a first node, a transmission line, a DC blocking capacitor, a second node, a third node, and an output terminal coupled in series, the first node selectively coupled to ground via a serially coupled capacitor and a first silicon germanium heterojunction bipolar transistor, the second node coupled to ground via a capacitor, and the third node selectively coupled to ground via a DC blocking capacitor, a resistor, and a second silicon germanium heterojunction bipolar transistor coupled in series. The input attenuator may also include a second input circuit parallel to the first input circuit and having structure similar to the first input circuit.

11 Claims, 7 Drawing Sheets

_US 8,279,019 B2_

MILLIMETER-WAVE SWITCHES AND ATTENUATORS

BACKGROUND OF THE DISCLOSURE

1. Field of the Disclosure

This disclosure relates to the problem of providing an effective switch (or switchable attenuator) on a silicon integrated circuit (IC) at millimeter-wave frequencies, which has the desired isolation or attenuation, while also providing very low insertion loss when no attenuation is desired.

2. Description of the Prior Art

While switches are straightforward to implement on a silicon IC (integrated circuit) at low-to-moderate frequencies, the implementation becomes increasingly difficult at millimeter-wave (mmWave) frequencies, because of losses caused by undesired parasitic circuit capacitance (C), resistance (R), and inductance (L).

In particular, series switches become lossy at mmWave frequencies, and a variety of circuits have been invented to reduce the loss of series switches. Shunt switch topologies can be less lossy at high frequencies, but the performance of even shunt topologies is ultimately limited by the on-state R and off-state RCL of the shunt switching element.

However, the related arts fail to overcome the problem of providing an effective switch (or switchable attenuator) on a silicon integrated circuit (IC) at millimeter-wave frequencies, which has the desired isolation or attenuation, while also providing very low insertion loss when no attenuation is desired.

SUMMARY OF THE DISCLOSURE

In one aspect, an mmWave attenuator may include a first input circuit having an RF_IN+ terminal, a first node, a transmission line, a DC blocking capacitor, a second node, a third node, and an output terminal coupled in series, the first node selectively coupled to ground via a serially coupled capacitor and a first silicon germanium heterojunction bipolar transistor, the second node coupled to ground via a capacitor, and the third node selectively coupled to ground via a DC blocking capacitor, a resistor, and a second silicon germanium heterojunction bipolar transistor coupled in series.

The mmWave attenuator may also include a second input circuit parallel to the first input circuit and having an RF_IN− terminal, a first node, a transmission line, a DC blocking capacitor, a second node, a third node, and an output terminal coupled in series, the first node selectively coupled to ground via a serially coupled capacitor and a third silicon germanium heterojunction bipolar transistor, the second node coupled to ground via a capacitor, and the third node selectively coupled to ground via a DC blocking capacitor, a resistor, and a fourth silicon germanium heterojunction bipolar transistor coupled in series, with the first silicon germanium heterojunction bipolar transistor, the second silicon germanium heterojunction bipolar transistor, the third silicon germanium heterojunction bipolar transistor, and the fourth silicon germanium heterojunction bipolar transistor each have a base terminal biased by substantially the same voltage signal from a first voltage terminal.

In another aspect, a shunt switching circuit may include a first circuit having a first port terminal, a first ¼ wave transmission line, a first node, and a second port terminal coupled in series and a first bipolar transistor having a collector terminal coupled to the first node, a base terminal biased by a first voltage from a first voltage terminal, and an emitter terminal coupled to a voltage source from a second voltage terminal.

The shunt switching circuit may further include a second circuit having the first port terminal, a second ¼ wave transmission line, a second node, and a third port terminal coupled in series, and a second transistor having a collector terminal coupled to the second node, a base terminal biased by a third voltage from a third voltage terminal, and an emitter terminal coupled to the voltage source These and other objectives of the present disclosure will no doubt become obvious to those of ordinary skill in the art after reading the following detailed description of the preferred embodiment that is illustrated in the various figures and drawings.

DETAILED DESCRIPTION

This disclosure presents several new shunt switching circuits which provide good performance, even at mmWave frequencies. These circuits may be implemented in a SiGe BiCMOS technology, but in some cases also may be implemented in Si CMOS or other IC technologies.

Figure 1:
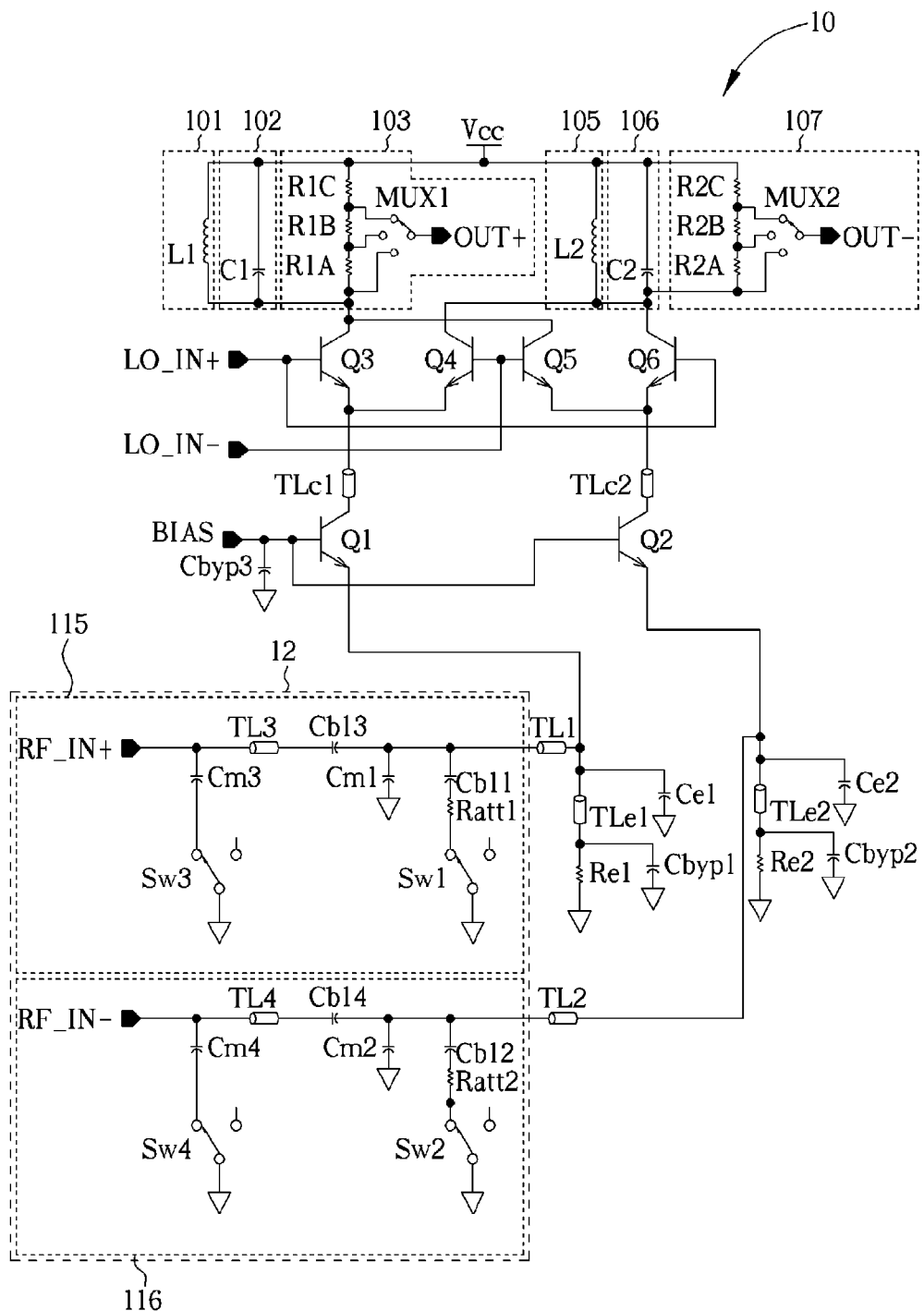
FIG. 1 is an input attenuator according to one embodiment of the disclosure.

In the first example, shown in FIG. 1, the switchable input attenuator 12 may be implemented as part of a mixer 10, e.g., an RF-to-IF mixer in an mmWave receiver. The mixer 10 may have signal processing capability and may be included in an RF receiver section of communication devices, such as cellular telephones. The disclosed techniques can also be used for both IC level design and printed circuit board (PCB) level designs to reduce noise coupling, chip area, power consumption and the number of components employed in a circuit. This mixer 10 accepts a very wide range of input signal powers, up to +5 dBm, and has a wide range of selectable gains.

In the mixer of FIG. 1, input signal powers up to approximately −4 dBm can be accommodated in a straightforward way. For example, a double-balanced mixer with a differential, common-base input, which has an iCP1 dB of −4 dBm may be used. Input signal powers >−4 dBm are most readily accommodated using an adjustable input attenuator. The input attenuator may be linear at signal levels of +5 dBm and also preferably have low loss when in the off (e.g., non-attenuating) state. The input attenuator may also preserve an accurate 50 Ω single-ended (100 Ω differential) input match in both on and off states.

The input attenuator 12 is shown conceptually in FIG. 1, which is a simplified schematic of the receiver RF-to-IF mixer 10 where the input attenuator 12 is within the dashed box. The RF-to-IF mixer 10 may include several parallel circuits such as a first parallel circuit 101 that may have a first terminal of an inductor L1 coupled with a supplied voltage Vcc and a second terminal of first inductor L1 coupled with both a first terminal of a bipolar transistor Q3 and with a first terminal of a bipolar transistor Q5. A second parallel circuit 102 may have a first terminal of a capacitor C1 coupled with the supplied voltage Vcc and a second terminal of the capacitor C1 coupled with both the first terminal of the bipolar transistor Q3 and the first terminal of the bipolar transistor Q5. A third parallel circuit 103 may comprise a plurality of resisters R1C, R1B, and R1A coupled in a first series, with a first terminal of the first series coupled with the supplied voltage Vcc and a second terminal of the first series coupled with both the first terminal of bipolar transistor Q3 and the first terminal of bipolar transistor Q5. A first multiplexer MUX1 may select for output OUT+ from voltages occurring at a node between R1C and R1B, at a node between R1B and R1A, or at a node between R1A and the first terminal of bipolar transistor Q3.

A fourth parallel circuit 105 may have a first terminal of a second inductor L2 coupled with the supplied voltage Vcc and a second terminal of the inductor L2 coupled with both a first terminal of a bipolar transistor Q4 and with a first terminal of a bipolar transistor Q6. A fifth parallel circuit 106 may have a first terminal of a capacitor C2 coupled with the supplied voltage Vcc and a second terminal of the capacitor C2 coupled with both the first terminal of the bipolar transistor Q4 and the first terminal of the bipolar transistor Q4. A sixth parallel circuit 107 may comprise a plurality of resisters R2C, R2B, and R2A coupled in a second series, with a first terminal of the second series coupled with the supplied voltage Vcc and a second terminal of the second series coupled with both the first terminal of bipolar transistor Q4 and the first terminal of bipolar transistor Q6. A second multiplexer MUX2 may select for output OUT– from voltages occurring at a node between R2C and R2B, at a node between R2B and R2A, or at a node between R2A and the first terminal of bipolar transistor Q4.

Control terminals of both the bipolar transistor Q3 and the bipolar transistor Q6 may be coupled to receive input signal LO_IN+ and control terminals of both the bipolar transistor Q4 and the bipolar transistor Q5 may be coupled to receive input signal LO_IN–. A first transmission line TLc1 may couple a first terminal of a bipolar transistor Q1 with a second terminal of the bipolar transistor Q3 and a second terminal of the bipolar transistor Q4. A second transmission line TLc2 may couple a first terminal of a bipolar transistor Q2 with a second terminal of the bipolar transistor Q5 and a second terminal of the bipolar transistor Q6. Control terminals of both the bipolar transistor Q1 and the bipolar transistor Q2 may be coupled to receive an input BIAS signal; the input BIAS signal also may be coupled to ground via a capacitor Cbyp3. A second terminal of the bipolar transistor Q1 may be coupled to the input attenuator 12 via a transmission line TL1, to ground via a capacitor Ce1, and to a first terminal of a transmission line TLe1. A second terminal of the transmission line TLe1 may be coupled to ground via a capacitor Cbyp1 and to ground via a resistor Re1. A second terminal of the bipolar transistor Q2 may be coupled to the input attenuator 12 via a transmission line TL2, to ground via a capacitor Ce2, and to a first terminal of a transmission line TLe2. A second terminal of the transmission line TLe2 may be coupled to ground via a capacitor Cbyp2 and to ground via a resistor Re2.

The input attenuator 12 of the mixer 10 may comprise two parallel input circuits. The first parallel input circuit 115 may be coupled to receive input signal RF_IN+ for transmission of the input signal RF_IN+ to the transmission line TL1 via a transmission line TL3 and a DC blocking capacitor Cb13 coupled in series. A node on the transmission line TL3 between the RF_IN+ input terminal and the capacitor Cb13 may be selectively coupled to ground via a capacitor Cm3 and a switch Sw3 according to the setting of the switch Sw3. A first node between the capacitor Cb13 and the transmission line TL1 may be coupled to ground via a capacitor Cm1 and a second node between the capacitor Cb13 and the transmission line TL1 may be selectively coupled to ground via a DC blocking capacitor Cb11, a resistor Ratt1, and a switch Sw1 according to the setting of the switch Sw1.

The second parallel input circuit 116 may be coupled to receive input signal $RF_{13}$ IN– for transmission of the input signal RF_IN– to the transmission line TL2 via a transmission line TL4 and a DC blocking capacitor Cb14 coupled in series. A node on the transmission line TL4 between the RF_IN– input terminal and the capacitor Cb14 may be selectively coupled to ground via a capacitor Cm4 and a switch Sw4 according to setting of the switch Sw4. A first node between the capacitor Cb14 and the transmission line TL2 may be coupled to ground via a capacitor Cm2 and a second node between the capacitor Cm2 and the transmission line TL2 may be selectively coupled to ground via a DC blocking capacitor Cb12, a resistor Ratt2, and a switch Sw2 according to the setting of the switch Sw2.

In FIG. 1, if the switches SW1-SW4 are in the open position, the input attenuator 12 is off (e.g., non-attenuating state). Transmission line TL1 and capacitor Cm1 can match the input of the mixer 10 to typically 50 Ω single-ended. Similarly, transmission line TL2 and capacitor Cm2 can match the other input of the mixer 10 to typically 50 Ω single-ended. Capacitors Cb13 and Cb14 may be DC-blocking capacitors. Transmission lines TL3 and TL4 may be designed with a characteristic impedance of 50 Ω, or whatever impedance the input of the mixer 10 is matched to. When the input attenuator 12 is off, transmission lines TL3 and TL4 do not significantly affect the mixer input impedance.

In FIG. 1, if the switches SW1-SW4 are in the closed position, the input attenuator 12 is on (e.g., attenuating state). If the switches SW1 and SW2 are closed, some of the input signal is shunted to ground through DC-blocking capacitor Cb11 and resistor Ratt1 (and also via DC-blocking capacitor Cb12 and resistor Ratt2). If resistor Ratt1 (=resistor Ratt2) ≈15 Ω, there would be about 10 dB of attenuation.

In FIG. 1, without transmission line TL3 and capacitor Cm3 (and transmission line TL4 and capacitor Cm4), connecting the lower end of resistor Ratt1 (and resistor Ratt2) to ground would lower the input impedance of the mixer 10, so that it was no longer well matched to 50 Ω. However, the length of transmission line TL3 and the value of capacitor Cm3 (as well as the length of transmission line TL4 and capacitor Cm4) can be selected such that when switch SW3 (and similarly SW4) is closed, transmission line TL3 and capacitor Cm3 rematch the input to 50 Ω single-ended as respectively also do the transmission line TL4 and capacitor Cm4.

Figure 2:
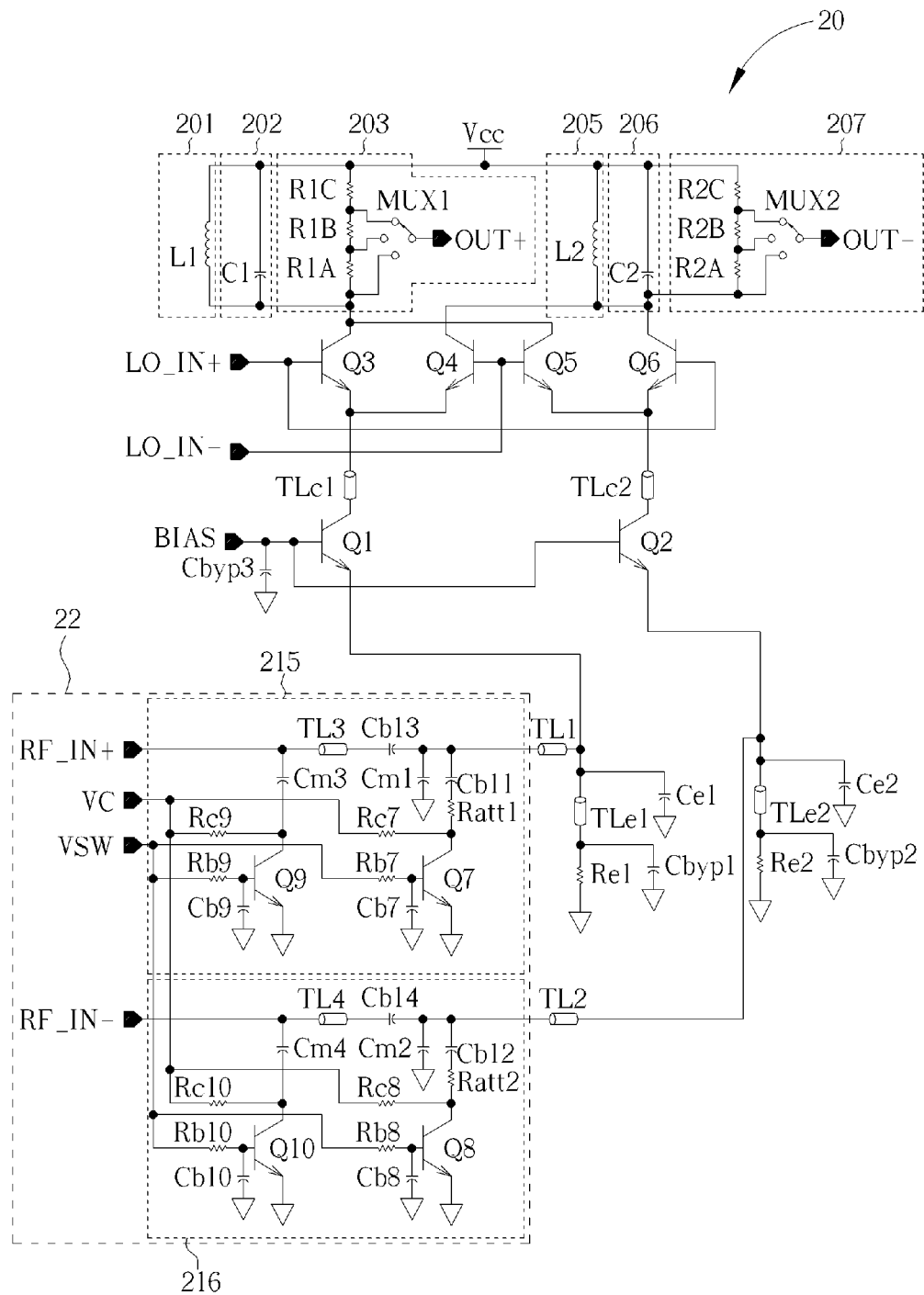
FIG. 2 details one embodiment of a mixer where the switches SW1-SW4 of FIG. 1 are implemented as bipolar transistors.

FIG. 2 details one embodiment of a mixer 20 that may include first, second, third, fourth, fifth, and sixth parallel circuits 201, 202, 203, 205, 206 and 207 respectively corresponding to the first, second, third, fourth, fifth, and sixth parallel circuits 101, 102, 103, 105, 106, and 107 of FIG. 1 as well as other components sharing the same labels. In the mixer 20, the switches SW1-SW4 of the switchable attenuator 12 of FIG. 1 are implemented as bipolar transistors Q7-Q10 in the switchable attenuator 22. Other apparent additions to the switchable attenuator 22 over the switchable attenuator 12 include a first input line receiving a bias voltage VC as input and a second input line receiving a control signal VSW. The first input line may couple bias voltage VC to a first terminal of the bipolar transistor Q7 via a resistor Rc7, bias voltage VC to a first terminal of the bipolar transistor Q9 via a resistor Rc9, bias voltage VC to a first terminal of the bipolar transistor Q8 via a resistor Rc8, and bias voltage VC to a first terminal of the bipolar transistor Q10 via a resistor Rc10. The second input line may couple a control signal VSW to a control terminal of the bipolar transistor Q7 via a resistor Rb7, the control signal VSW to a control terminal of the bipolar transistor Q9 via a resistor Rb9, the control signal VSW to a control terminal of the bipolar transistor Q8 via a resistor Rb8, and the control signal VSW to a control terminal of the bipolar transistor Q10 via a resistor Rb10. The control terminal of the bipolar transistor Q7 may also be coupled to ground via a capacitor Cb1, the control terminal of the bipolar transistor Q9 may also be coupled to ground via a capacitor Cb9, the control terminal of the bipolar transistor Q8 may also be coupled to ground via a capacitor Cb8, and the control terminal of the bipolar transistor Q10 may also be coupled to ground via a capacitor Cb10.

When the control signal VSW is high, bipolar transistors Q7-Q10 are on in a saturated state. The on-state AC resistance of bipolar transistor Q7 in series with resistor Ratt1 (and bipolar transistor Q8 in series with resistor Ratt2) may be chosen to be 15 Ω, or whatever value gives the desired attenuation. Higher base current in bipolar transistors Q7-Q10 forces the bipolar transistors Q7-Q10 deeper into saturation and reduces the on-state resistance. Bipolar transistors Q9 and Q10 could have on-state resistance which is small compared to the impedance of capacitors Cm3 and Cm4 at 60 GHz (or whatever the operating frequency is).

In FIG. 2, when the control signal VSW is low, bipolar transistors Q7-Q10 are off. Their off-state capacitance could be low compared to other capacitances in the circuit, such as capacitors Cm1-Cm2. A bias voltage VC is applied to the collectors of bipolar transistors Q7-Q10 through large resistors Rc7-Rc10 to prevent the large AC signal swings from forward biasing the base-collector junctions when the bipolar transistors Q7-Q10 are in the off-state.

Figure 3:
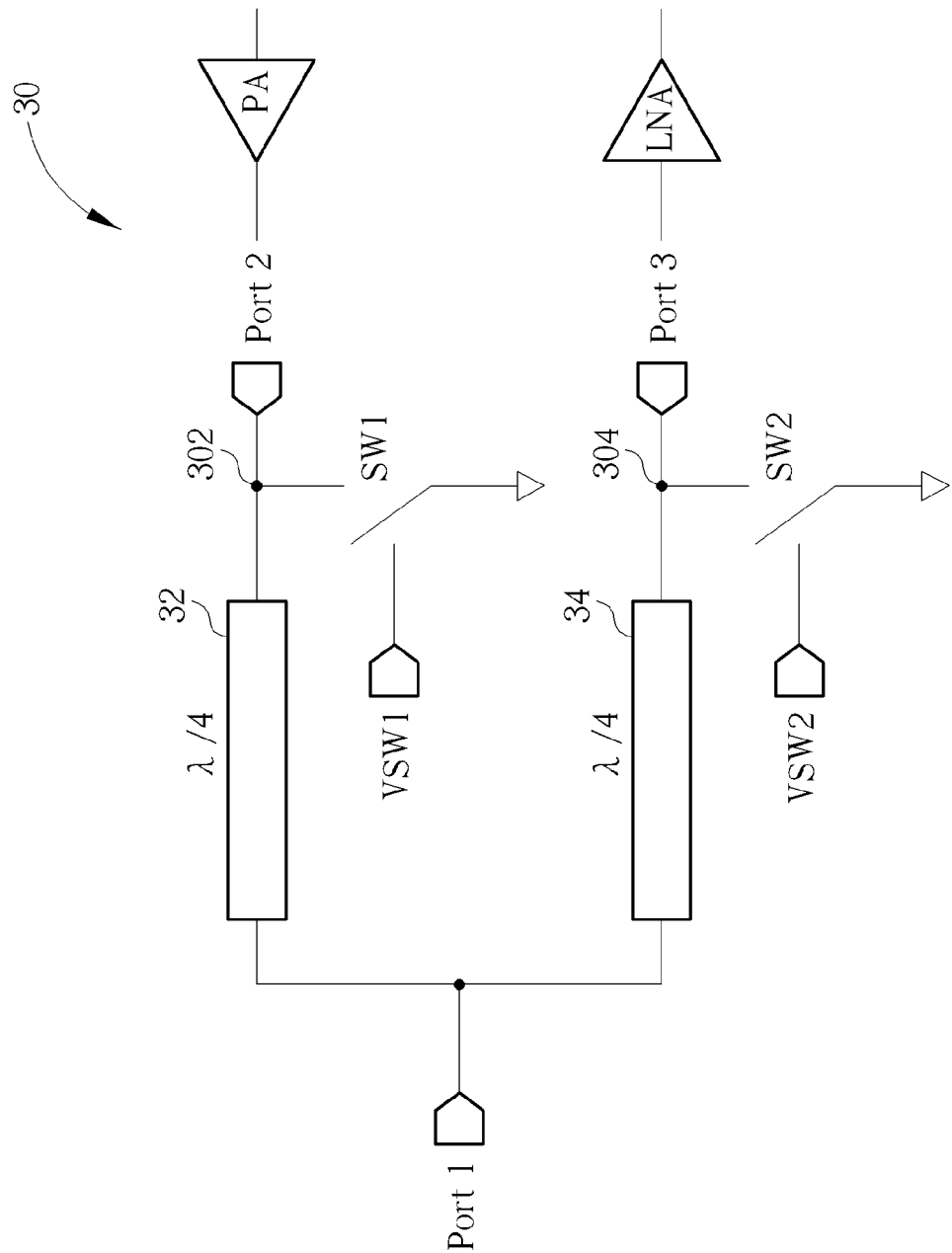
FIG. 3 illustrates second example of a shunt switching circuit in a millimeter-wave transmit/receive switch.

A second example of a shunt switching circuit is a millimeter-wave transmit/receive (T/R) switch is shown in FIG. 3. The millimeter-wave T/R switch is a highly desired circuit block for cost and complexity reduction in the 60 GHz radio application. The most common application is to facilitate antenna sharing between transmitter and receiver. Another application of the same switch topology is in discrete phase-shifters. In both cases, the switch has low on-state insertion-loss to minimize its impact on the system link budget.

As seen in FIG. 3, a shunt switching circuit 30 may comprise a first circuit having Port 1 terminal, a first ¼ wave transmission line 32, a first node 302, and a Port 2 terminal coupled in series. A switch SW1 controlled by a control signal VSW1 couples or decouples the first node 302 with ground. The Port 2 terminal may receive input from a power amplifier PA. The shunt switching circuit 30 may further comprise a second circuit parallel to the first circuit having the Port 1 terminal, a second ¼ wave transmission line 34, a second node 304, and a Port 3 terminal coupled in series. A switch SW2 controlled by a control signal VSW2 couples or decouples the second node 304 with ground. The Port 3 terminal may output to a low noise amplifier LNA.

The lowest loss T/R switch topology is one without a series element, as in FIG. 3. To route the signal from Port 1 to Port 3, the switch SW1 is closed and the switch SW2 is opened. When the switch SW1 is closed, a short is created at Port 2 and the transmission line TL2 transforms the short into an open at Port 1. A variation on this switch is a variable attenuator whereby the signal passed from Port 1 to Port 3 is attenuated when the switch SW2 is partially on.

This type of T/R switch may require a semiconductor device with ideal switching characteristics, and hence has traditionally been implemented with MOSFETs. However, MOSFETs display several disadvantages that make them less suitable for the 60 GHz application:

(1). In a CMOS or BiCMOS technology with minimum FET channel lengths less than or equal to 90 nm, the maximum reliable drain-to-source voltage ($V_{DS}$) is equal to 1.2V. Thus, MOSFETs are incapable of reliably handling the power levels (>10 dBm) seen in 60 GHz radio.

(2). In a CMOS or BiCMOS technology with minimum FET channel lengths greater than or equal to 130 nm, the MOSFET is a lossy switch at 60 GHz.

Figure 4:
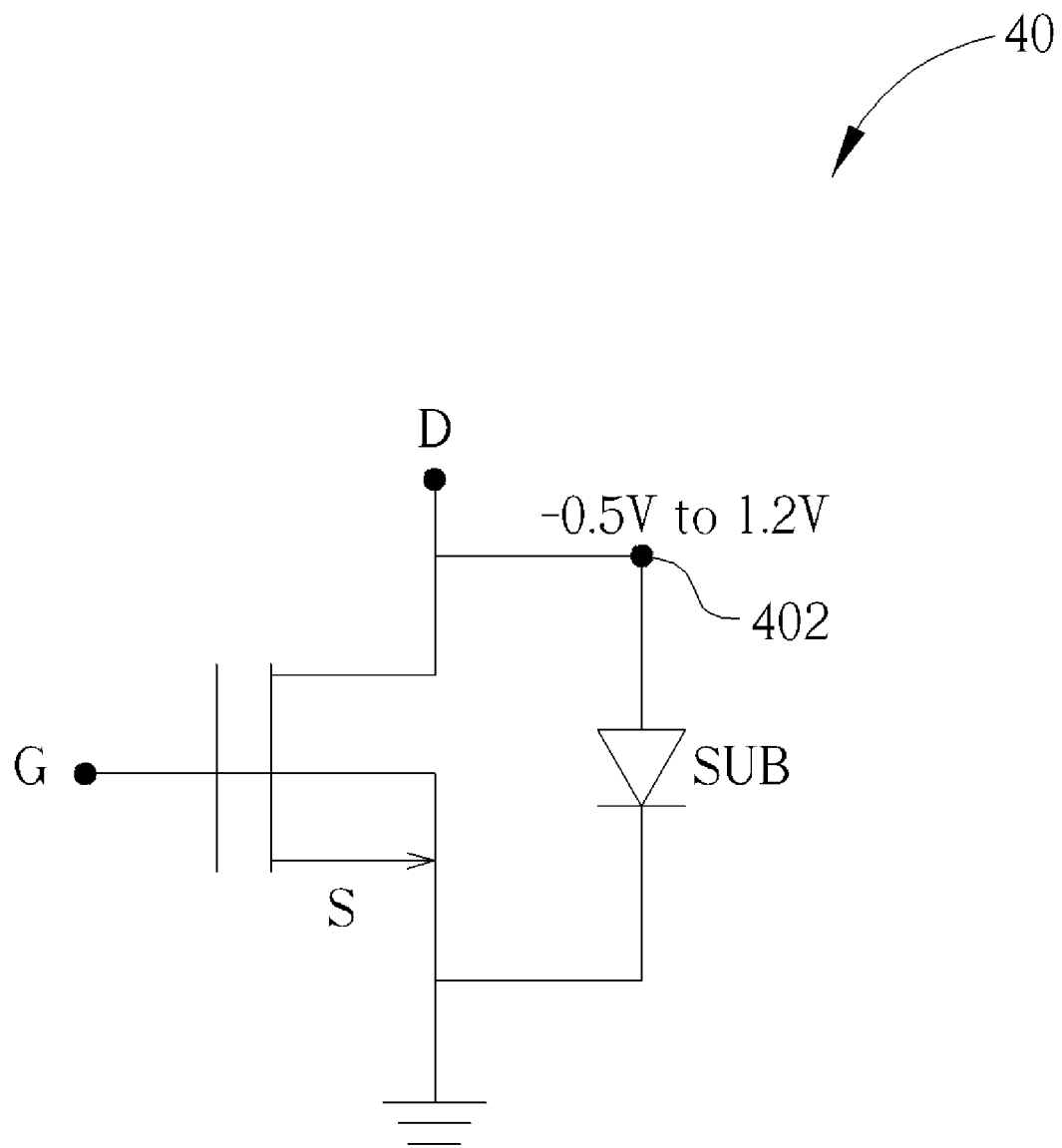
FIG. 4 illustrates a MOSFET switch in its off-state driven by a power amplifier.

As an illustration of disadvantage (1), consider the MOSFET switch 40 in its off-state driven by a power amplifier, as illustrated in FIG. 4.

1. The maximum allowable voltage at node 402 is $V_{DS\text{-}MAX}$ (likely 1.2V in CMOS).

2. The minimum allowable voltage at node 402 is −0.5V, when the drain-substrate diode begins to turn on.

3. The limitation on swing is therefore 1.7 Vpp, which represents 8.5 dBm into 50 ohms.

Figure 5:
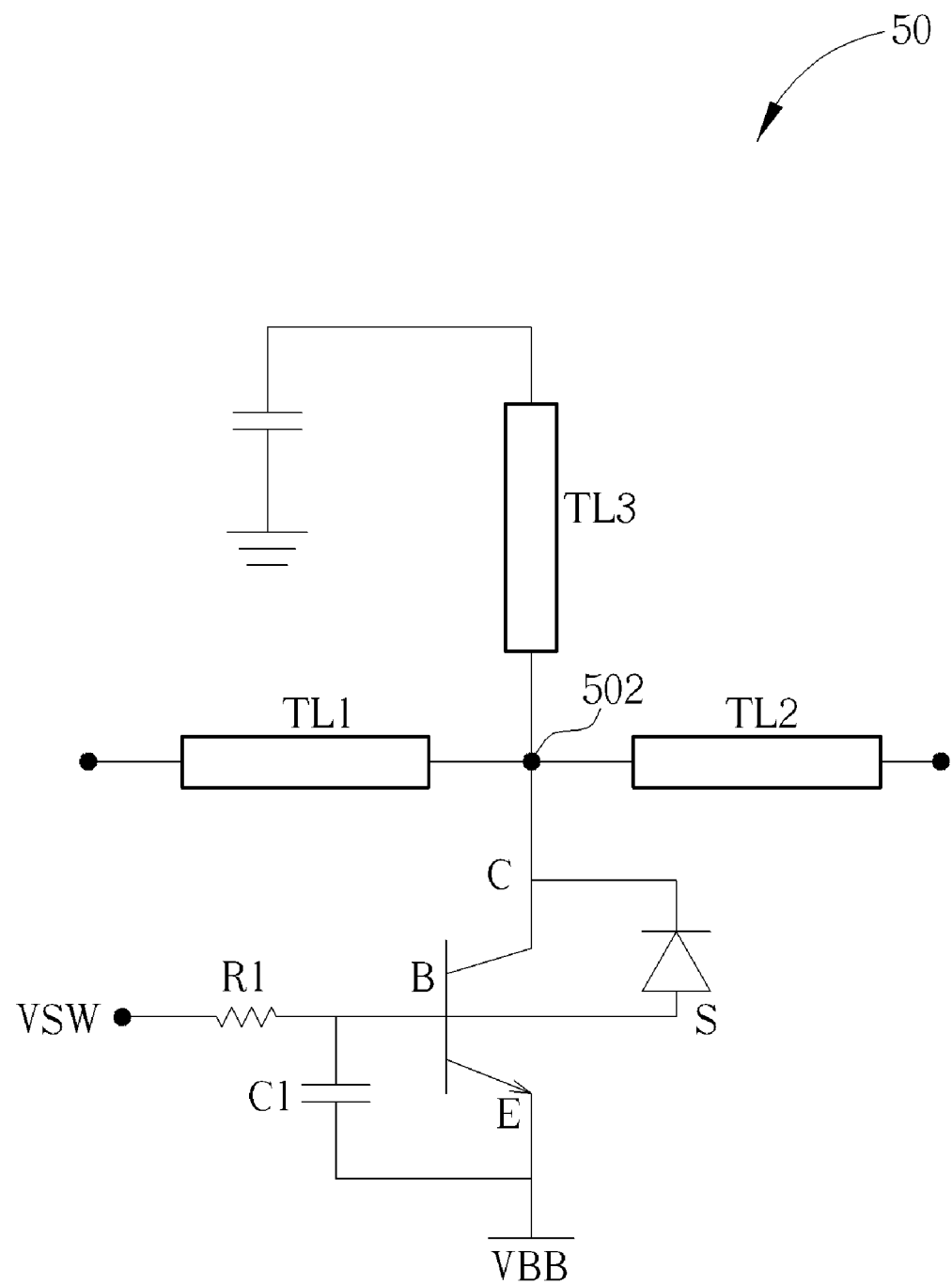
FIG. 5 illustrates an implementation of a basic SiGe HBT switching device.

To avoid these problems, a SiGe HBTs (silicon germanium heterojunction bipolar transistor) may be used to implement such type of the quarter-wave switch. The implementation of the basic SiGe HBT switching device 50 is illustrated in FIG. 5. Note that this is a similar implementation as in FIG. 2 (RF-attenuator utilized in the mixer). Once again, the control signal VSW is used to vary the on-state resistance of the switch. Referring to FIG. 5:

1. When the control signal VSW is high, the residual resistance of the SiGe HBT Q1 is collector-emitter resistance $R_{CE}$ in saturation ($R_{CE\text{-}SAT}$). Additionally, the collector-base diode is forward biased (current is limited by resistor R1) which further reduces the resistance from node 502 to AC ground to $R_{CE\text{-}SAT}//R_{BASE}$.

2. When the control signal VSW is low, the SiGe HBT Q1 is off, and in this state presents a very large resistance at the collector C (e.g., the node A).

3. Transmission lines TL1-TL3 tune out any off-state parasitic capacitance.

Returning to voltage limitations when the SiGe HBT is in its off state driven by the power amplifier:

1. The maximum allowable voltage at node 502 in FIG. 5 is BVCES (collector-emitter (base-emitter shorted) breakdown voltage) (capacitor C1 is large, representing a short at the frequency of operation).

2. The minimum allowable voltage at node 502 in FIG. 5 is −0.5V when the collector-substrate diode turns on.

3. Typically BVCES=3V, which brings the allowed swing at node 1 to 3.5V, or about 15 dBm into 50 ohms.

Figure 6:
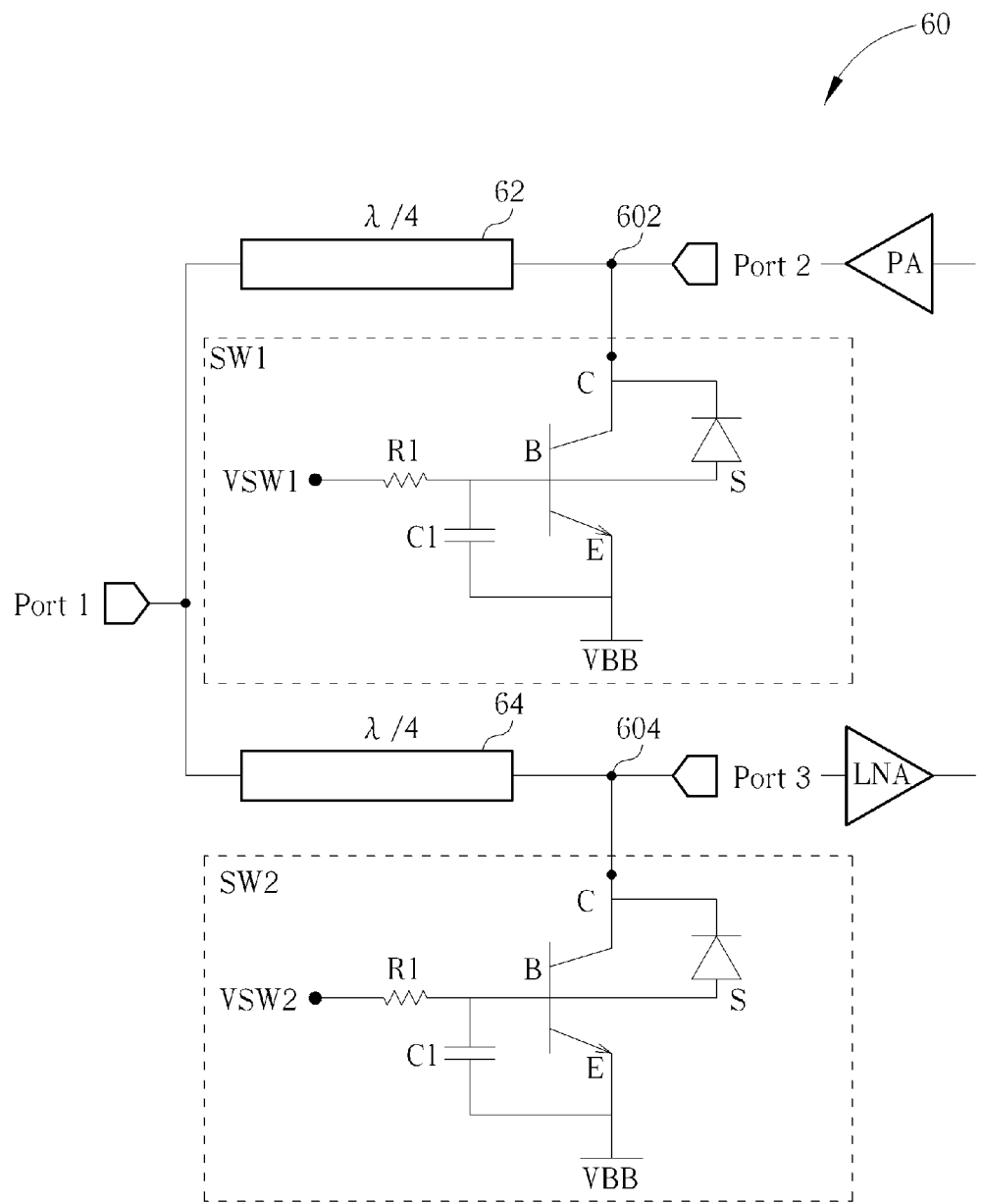
FIG. 6 illustrates how switch elements of FIG. 5 are used to build a transmit/receive switch.

4. Assuming symmetrical signal swing, the optimum value of VBB is 3.5/2+−0.5=1.25V FIG. 6 shows how the switch elements of FIG. 5 are used to build a T/R switch 50. A difference between the switch of FIG. 3 and the switch of FIG. 6 is that SW1 and SW2 of FIG. 6 each comprise a SiGe HBT as shown. Each SiGe HBT receives a control signal (the switch SW1 receives the control signal VSW1, and the switch SW2 receives the control signal VSW2) which is respectively routed through a resistor R1 to a control terminal B and also through a capacitor C1 to the emitter terminal E and VBB of each SiGe HBT. The collector C of the SiGe HBT of the switch SW1 is coupled to a first node 602 between the first ¼ wave transmission line 62 and Port 2 terminal. The collector C of the SiGe HBT of the switch SW2 is coupled to a second node 604 between the second ¼ wave transmission line 64 and Port 3 terminal. Because one switch element is always on, the collector bias voltage of both switch elements is always 1.25V, which is the optimum large-signal bias for the switch in the off state.

Figure 7:
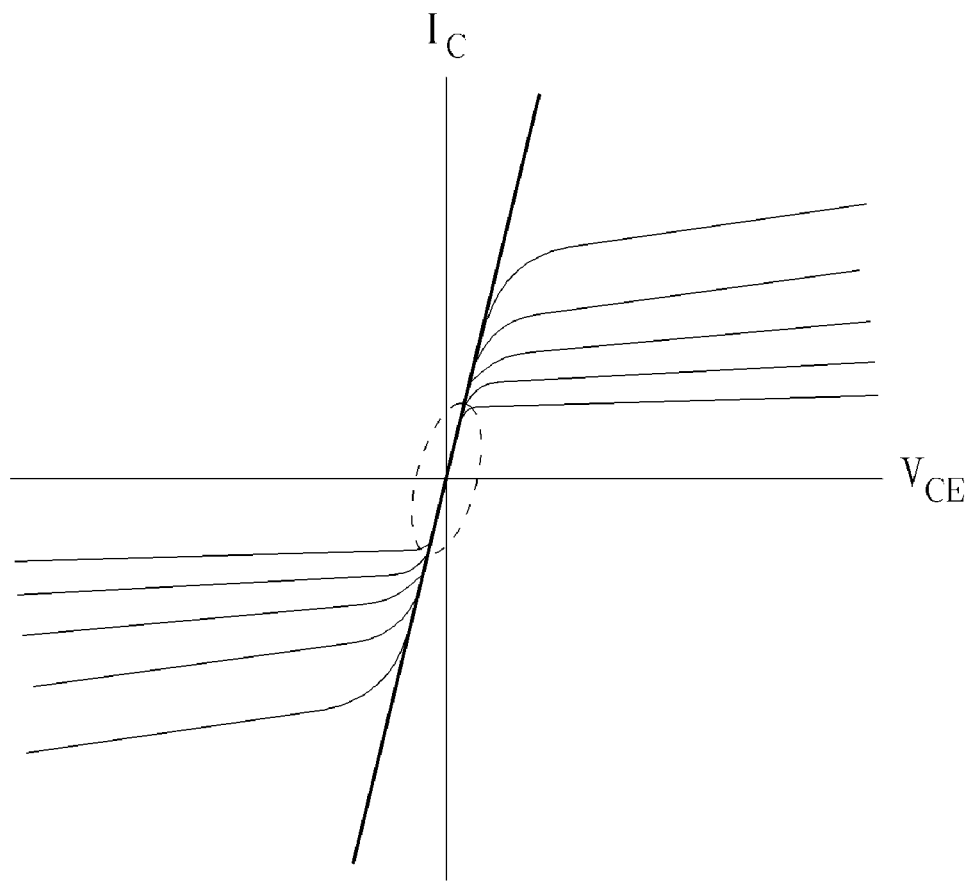
FIG. 7 illustrates that any signal swing present at the collector of the on-state switch causes the region of operation of the on-state switch to move between the forward and reverse saturation modes.

Any signal swing present at the collector of the on-state switch causes the region of operation of the on-state switch to move between the forward and reverse saturation modes, as shown in FIG. 7.

The circuits presented within this disclosure represent new and effective switching in mmWave frequencies. The use of properly biased silicon germanium heterojunction bipolar transistors as disclosed is highly advantageous, and provides an effective switch (or switchable attenuator) on a silicon integrated circuit (IC) at millimeter-wave frequencies, which has the desired isolation or attenuation, while also providing very low insertion loss when no attenuation is desired.

Those skilled in the art will readily observe that numerous modifications and alterations of the device and method may be made while retaining the teachings of the disclosure. Throughout this disclosure, the forms of the term "couple" are intended to mean directly coupled with no intervening active elements or indirectly coupled with possibly one or more intervening active elements and both interpretations are intended to apply to all disclosed embodiments and figures.

What is claimed is:

1. An mmWave attenuator, comprising:
a first input circuit having a first input terminal, a first node, a first transmission line, a first DC blocking capacitor, a second node, a third node, and a first output terminal coupled in series, the first node selectively coupled to ground via a serially coupled second capacitor and a first switch, the second node coupled to ground via a third capacitor, and the third node selectively coupled to ground via a second DC blocking capacitor, a first resistor, and a second switch coupled in series.

2. The mmWave attenuator of claim 1, further comprising:
a second input circuit parallel to the first input circuit and having a second input terminal, a fourth node, a second transmission line, a third DC blocking capacitor, a fifth node, a sixth node, and second output terminal coupled in series, the fourth node selectively coupled to ground via a serially coupled third capacitor and a third switch, the fifth node coupled to ground via a fourth capacitor, and the sixth node selectively coupled to ground via a fourth DC blocking capacitor, a second resistor, and a fourth switch coupled in series.

3. The mmWave attenuator of claim 1 wherein the first switch and the second switch are silicon germanium heterojunction bipolar transistors.

4. The mmWave attenuator of claim 1, being an input stage of a down conversion mixer in the mmWave receiver.

5. The mmWave attenuator of claim 1 wherein the first switch and the second switch are each a bipolar transistor having a base terminal biased by a substantially identical voltage signal from a first voltage terminal.

6. The mmWave attenuator of claim 5 wherein a third resistor is serially coupled between the base terminal of the first switch and the first voltage terminal.

7. The mmWave attenuator of claim 6 wherein a fifth capacitor is serially coupled between the base terminal of the first switch and ground.

8. The mmWave attenuator of claim 6 wherein a fourth resistor is serially coupled between the base terminal of the second switch and the first voltage terminal.

9. The mmWave attenuator of claim 8 wherein a fifth capacitor is serially coupled between the base terminal of the first switch and ground and a sixth capacitor is serially coupled between the base terminal of the second switch and ground.

10. An mmWave attenuator, comprising:
a first input circuit having a first input terminal, a first node, a first transmission line, a first DC blocking capacitor, a second node, a third node, and a first output terminal coupled in series, the first node selectively coupled to ground via a serially coupled first capacitor and a first bipolar transistor, the second node coupled to ground via a second capacitor, and the third node selectively coupled to ground via a second DC blocking capacitor, a first resistor, and a second bipolar transistor coupled in series; and
a second input circuit parallel to the first input circuit and having second input terminal, a fourth node, a second transmission line, a third DC blocking capacitor, a fifth node, a sixth node, and a second output terminal coupled in series, the fourth node selectively coupled to ground via a serially coupled third capacitor and a third bipolar transistor, the fifth node coupled to ground via a fourth capacitor, and the sixth node selectively coupled to ground via a fourth DC blocking capacitor, a second resistor, and a fourth bipolar transistor coupled in series;
wherein the first bipolar transistor, the second bipolar transistor, the third bipolar transistor, and the fourth bipolar transistor each have a base terminal biased by a substantially identical voltage signal from a first voltage terminal.

11. The mmWave attenuator of claim 10, wherein the first bipolar transistor, the second bipolar transistor, the third bipolar transistor, and the fourth bipolar transistor are each a silicon germanium heterojunction bipolar transistor.

* * * * *